(12) United States Patent
Yu et al.

(10) Patent No.: US 10,629,180 B2
(45) Date of Patent: Apr. 21, 2020

(54) DRIVING CIRCUIT FOR ELECTRONIC DEVICE AND ASSOCIATED SYSTEM AND METHOD

(71) Applicant: Hangzhou Boon Electronics Co., LTD., Hangzhou (CN)

(72) Inventors: Chaoyang Yu, Hangzhou (CN); Huijiang Xia, Hangzhou (CN)

(73) Assignee: Hangzhou Boon Electronics Co., LTD., Hangzhou (CN)

( * ) Notice: Subject to any disclaimer, the term of this patent is extended or adjusted under 35 U.S.C. 154(b) by 138 days.

(21) Appl. No.: 15/894,072

(22) Filed: Feb. 12, 2018

(65) Prior Publication Data
US 2018/0166056 A1  Jun. 14, 2018

(30) Foreign Application Priority Data

Oct. 10, 2017 (CN) .......................... 2017 1 0934091
Oct. 10, 2017 (CN) .......................... 2017 1 0934093
Oct. 10, 2017 (CN) .......................... 2017 1 0934420

(51) Int. Cl.
| | |
|---|---|
| *H04R 3/00* | (2006.01) |
| *G10K 9/12* | (2006.01) |
| *H03K 4/50* | (2006.01) |
| *G05F 3/16* | (2006.01) |
| *H03K 5/24* | (2006.01) |

(52) U.S. Cl.
CPC ................. *G10K 9/12* (2013.01); *G05F 3/16* (2013.01); *H03K 4/50* (2013.01); *H03K 5/24* (2013.01); *H04R 3/00* (2013.01)

(58) Field of Classification Search
CPC ........................................................ H04R 3/00
See application file for complete search history.

(56) References Cited

U.S. PATENT DOCUMENTS

| | | | | |
|---|---|---|---|---|
| 4,796,503 A * | 1/1989 | Lin | ...................... | G04G 13/021 84/738 |
| 5,126,545 A * | 6/1992 | Barkan | .............. | G06K 7/10881 235/462.25 |
| 5,132,636 A * | 7/1992 | Hori | ....................... | H03B 28/00 327/100 |
| 5,461,296 A * | 10/1995 | Messersmith | ............. | H02P 1/26 318/779 |
| 5,675,311 A * | 10/1997 | Burnett | .................... | G08B 3/10 116/147 |
| 2001/0020856 A1 * | 9/2001 | Yamakita | .............. | B06B 1/0223 327/108 |

(Continued)

FOREIGN PATENT DOCUMENTS

CN           105702245 A      6/2016

*Primary Examiner* — Olisa Anwah
(74) *Attorney, Agent, or Firm* — Lathrop GPM LLP

(57) ABSTRACT

The present application discloses a driving circuit for driving an electronic device, the driving circuit has a voltage regulating circuit, a waveform generating circuit and a driving stage circuit. An input of the voltage regulating circuit is coupled to a power source. An input of the waveform generating circuit is coupled to an output of the voltage regulating circuit, and an output of the waveform generating circuit provides a periodic wave signal. The driving stage circuit has a signal input coupled to the output of the waveform generating circuit, a power input coupled to the power source, and an output for driving the electronic device.

17 Claims, 5 Drawing Sheets

(56) References Cited

U.S. PATENT DOCUMENTS

| | | | | |
|---|---|---|---|---|
| 2006/0138624 A1* | 6/2006 | Kwon | ............ | H01L 24/49 |
| | | | | 257/678 |
| 2008/0247574 A1* | 10/2008 | Hou | ............ | G08B 3/10 |
| | | | | 381/190 |
| 2009/0102669 A1* | 4/2009 | Lin | ............ | G04G 13/021 |
| | | | | 340/575 |
| 2010/0176851 A1* | 7/2010 | Jiang | ............ | H03K 7/08 |
| | | | | 327/115 |
| 2015/0317971 A1* | 11/2015 | Nagashima | ............ | H04R 3/00 |
| | | | | 340/388.1 |
| 2018/0041118 A1* | 2/2018 | Cohen | ............ | H02M 1/08 |
| 2018/0091040 A1* | 3/2018 | Wong | ............ | H02M 1/08 |

* cited by examiner

DRIVING CIRCUIT FOR ELECTRONIC DEVICE AND ASSOCIATED SYSTEM AND METHOD

CROSS-REFERENCE TO RELATED APPLICATIONS

This application claims priority to and the benefit of Chinese Patent Applications No. 201710934420.0, No. 201710934091.x, and No. 201710934093.9, filed on Oct. 10, 2017, which are incorporated herein by reference in its entirety.

TECHNICAL FIELD

The present invention relates generally to electronic circuit, and more particularly but not exclusively relates to driving circuit for electronic device, and the associated driving system and method.

BACKGROUND

Prior art buzzer driving circuits as illustrated in FIG. 1 are usually composed of discrete components such as power transistor and capacitor. Accordingly, the bulk of a prior art driving circuit is large and is not convenient for circuit debugging. Moreover, it has drawbacks of narrow working voltage range, and is usually limited to below 5 volts for driving the buzzer.

SUMMARY

In one embodiment, a driving circuit for driving an electronic device comprises: a voltage regulating circuit having an input and an output, wherein the input is coupled to a power source; a waveform generating circuit having an input and an output, wherein the input of the waveform generating circuit is coupled to the output of the voltage regulating circuit, and the output of the waveform generating circuit is configured to provide a periodic wave signal; and a driving stage circuit having a signal input, a power input and an output, wherein the signal input is coupled to the output of the waveform generating circuit, the power input is coupled to the power source, and the output of the driving stage circuit is configured to drive the electronic device.

In another embodiment, a driving system for an electronic device comprises: a buzzer; a voltage regulating circuit having an input and an output, wherein the input is coupled to a power source; a waveform generating circuit having an input and an output, wherein the input of the waveform generating circuit is coupled to the output of the voltage regulating circuit, and the output of the waveform generating circuit is configured to provide a periodic wave signal; and a driving stage circuit having a signal input, a power input and an output, wherein the signal input is coupled to the output of the waveform generating circuit, the power input is coupled to the power source, and the output of the driving stage circuit is coupled to the buzzer.

In yet another embodiment, a method of driving an electronic device comprises: converting an input voltage into a regulated reference voltage; supplying a waveform generating circuit by the regulated reference voltage and generating a periodic wave signal; supplying the periodic wave signal to a signal input of a driving stage circuit, supplying the input voltage into a power input of the driving stage circuit and providing a driving signal for driving the electronic device.

BRIEF DESCRIPTION OF THE DRAWINGS

Non-limiting and non-exhaustive embodiments are described with reference to the following drawings. The drawings are only for illustration purpose. Usually; the drawings only show part of the devices of the embodiments.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Throughout the specification and claims, the term "couple" as used herein, is defined as either directly, or indirectly connecting one to another via intermediary such as via electrical conducting materials which may have parasitic inductance or capacitance, or via other material(s) or component(s) as would be known to person skilled in the art without departure from the spirit and scope of the invention as defined by the appended claims.

Figure 1:
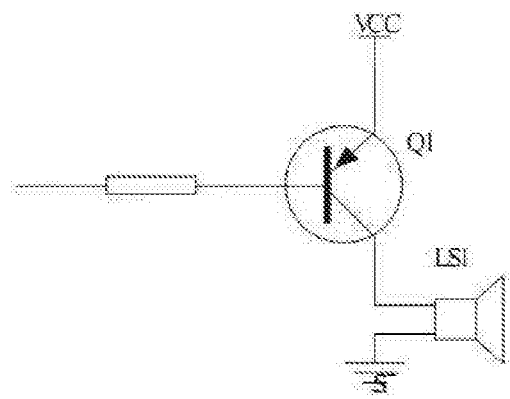
FIG. 1 illustrates a prior art driving circuit for a buzzer.

Buzzer is a commonly used device which produces sounds when a direct-current voltage is applied at two ends of an active buzzer or an alternating-current voltage is applied at two ends of a negative buzzer. FIG. 1 illustrates a prior art driving circuit for a buzzer. Where a triode transistor acts as a switch, the high-leveled voltage applied at its base makes the triode saturate and produce sounds, and the low-leveled voltage applied at its base turns off the triode and stops sounds. Moreover, since a buzzer is an inductive device in its nature, the current in it can not change abruptly, and thus a freewheeling diode is required to allow current flowing through. Otherwise, spike voltage will generate across the buzzer and will damage the triode transistor, and further the other parts of the whole system will be interrupted.

The prior art buzzer driving circuits or driver chips require many external discrete components and is not convenient for circuit installation and circuit debugging.

Figure 2:
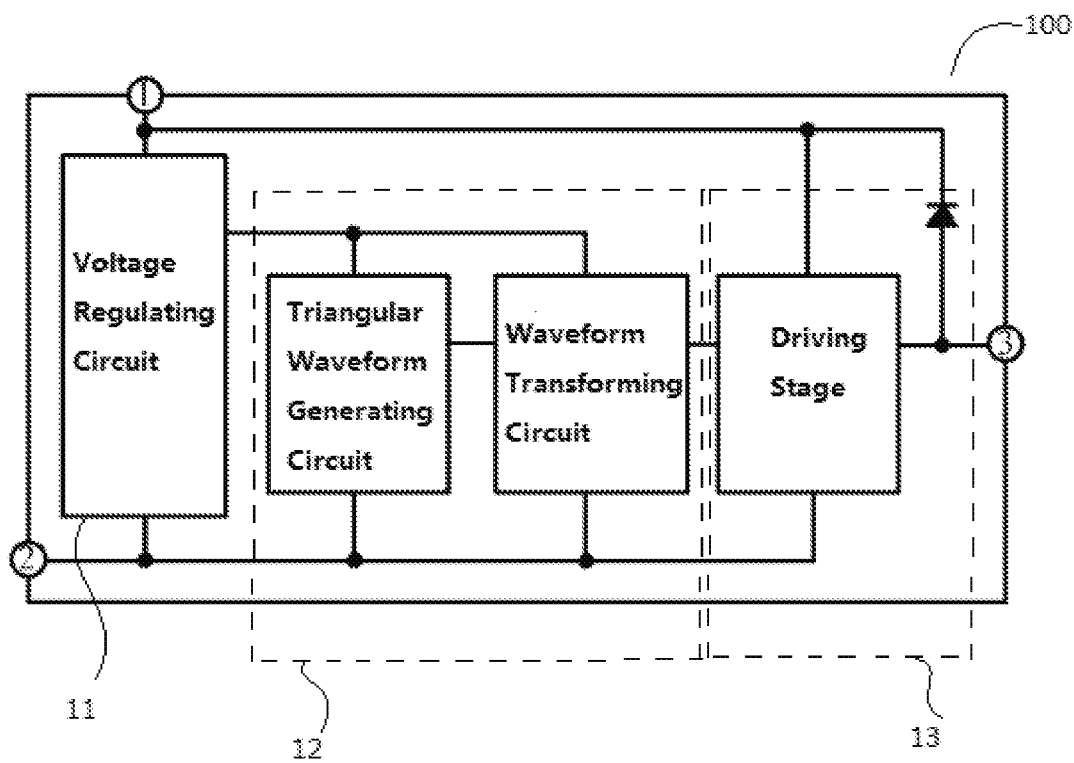
FIG. 2 illustrates a block diagram of a driving circuit according to an embodiment of the present invention.

In order to eliminated one or more of the above drawbacks, FIG. 2 illustrates a block diagram of a driving circuit according to an embodiment of the present invention. As shown in FIG. 2, the driving circuit 100 comprises a voltage regulating circuit 11, a waveform generating circuit 12 and a driving stage circuit 13. The voltage regulating circuit 11 has an input and an output, wherein the input is coupled to a power source (at pin 1). The waveform generating circuit 12 may further comprise a triangular waveform generating circuit and a waveform transforming circuit. The waveform generating circuit 12 has an input and an output, wherein the input of the waveform generating circuit is coupled to the output of the voltage regulating circuit 11 to receive a regulated reference voltage, and the output of the waveform generating circuit 12 is configured to provide a periodic wave signal. The driving stage circuit 13 has a signal input, a power input and an output, wherein the signal input of the driving stage circuit 13 is coupled to the output of the waveform generating circuit 12, the power input of the driving stage circuit 13 is coupled to the power source (at pin 1), and the output (pin 3) of the driving stage circuit 13 is used to drive an electronic device.

In one embodiment, the electronic device is a buzzer. In a particular embodiment, the buzzer is an inductive buzzer.

Figure 10:
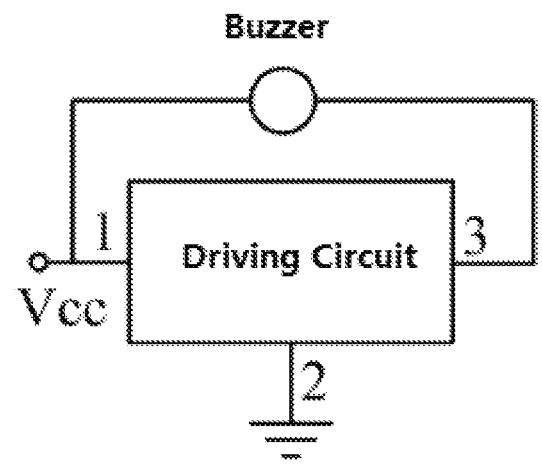
FIG. 10 illustrates a driving system according to an embodiment of the present invention.

By adopting this configuration, in an embodiment, the driving circuit which is preferred to be integrated entirely in a semiconductor chip could have a completed or almost completed driving function, and requires few or no external component, referring to FIG. 10. Accordingly, circuit installation and circuit debugging are simple and cost-saving.

In a preferred embodiment, the voltage regulating circuit comprises a current source TC1 which has an input and an output, and a band gap reference which has an input and an output, wherein the input of the current source is coupled to the power source, and the output of the current is coupled to the band gap reference, and the output of the band gap reference is coupled to the input of the waveform generating circuit.

Figure 3:
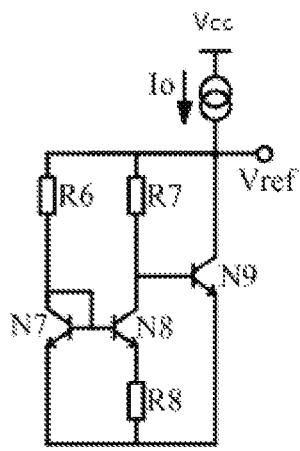
FIG. 3 illustrates a circuit diagram of a voltage regulating circuit comprising a band gap reference circuit according to an embodiment of the present invention.

FIG. 3 illustrates a circuit diagram of a voltage regulating circuit including a band gap reference circuit according to an embodiment of the present invention. The band gap reference circuit comprises three P-type triode transistors N7, N8 and N9, resistors R6, R7 and R8, where a first end of resistor R6 and a first end of resistor R7 are coupled to the output of a current source Io, a second end of resistor R6 is coupled to the collector of transistor N7, the second end of resistor R7 is coupled to the collector of transistor N8 and the base of transistor N9. The base of transistor N7, the base of transistor N8 and the collector of transistor N7 are coupled together. The emitter of transistor N8 are coupled to the ground through resistor R8. The collector of transistor N9 is coupled to the output of current source Io. And the emitters of transistors N7 and N9 are coupled to the ground. Wherein a base-emitter voltage of a triode transistor satisfies:

$$\Delta V_{BE} = \frac{kT}{q} \ln \frac{Ie7/Ae7}{Ie8/Ae8}$$

In the equation, Ie7, Ie8, Ae7 and Ae8 represent the current at emitters and the effective emitter areas of transistors N7 and N8 respectively.

The band gap reference voltage generated by the band gap reference circuit is:

Vref=VBE9+(ΔVBE/R8+IB9)*R7

IB9=Ic9/β

ΔIB9=ΔIc9/β=ΔIo/β

ΔVref=ΔIB9*R7=(ΔIo/β)*R7

Where IB9 represents the current at the base of transistor N9, Ic9 represents the current at the collector of transistor N9, β represents the amplification coefficient of the transistor, VBE9 represents the negative temperature coefficient and ΔVBE represents the positive temperature coefficient. And in theory, by well adjusting the ratios between Ae7, Ae8 and R7, R8, the voltage Vref could achieve zero temperature coefficient.

However, this voltage regulating circuit has some drawbacks as below: the residual current from the current source Io (including a starting and biasing circuit) is entirely absorbed by transistor N9, that is, the collector current Ic9 would change with the change of current source Io, Since Ie9 is decided by IB9, and change of IB9 would lead to change of the voltage across resistor R7, and the voltage Vref would also change with the variation of the current source Io. And the linear performance of the band gap reference voltage Vref is not good enough.

Accordingly, in order to improve the linear performance and stability of the band gap reference voltage, a preferred voltage regulating circuit is provided.

Figure 4:
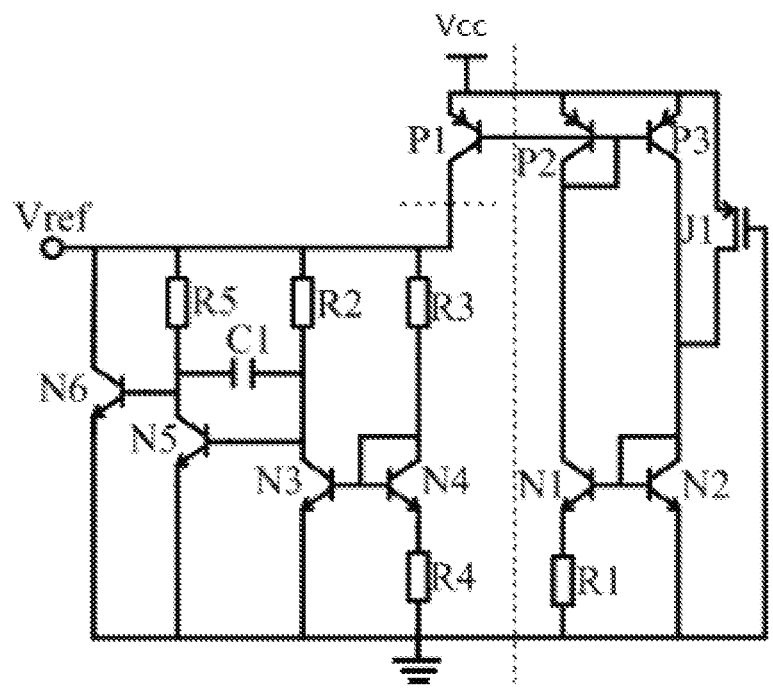
FIG. 4 illustrates a circuit diagram of a voltage regulating circuit comprising a band gap reference circuit according to a preferred embodiment of the present invention.

FIG. 4 illustrates a circuit diagram of a voltage regulating circuit of the circuit in FIG. 2 according to a preferred embodiment of the present invention. In this preferred embodiment, the voltage regulating circuit comprises a band gap reference circuit, a current source circuit which is coupled to the band gap reference circuit, and a residual current absorption circuit. The current source circuit is used to provide current source for the band gap reference circuit, the band gap reference circuit is used to provide the band gap reference voltage Vref, and the residual current absorption circuit is used to absorb the residual current of the current source and to improve the linearity and stability of the band gap reference voltage. In one embodiment, the transistors in the band gap reference circuit are bipolar transistors.

The band gap reference circuit comprises three transistors N3, N4 and N5, and three resistors R2, R3 and R4, wherein a first end of resistor R2 and a first end of resistor R3 are coupled to the output of the band gap reference circuit, the second end of resistor R3 is coupled to the collector of transistor N4, the second end of resistor R2 is coupled to the collector of transistor N3 and the base of transistor N5, the bases of transistors N3 and N4 are coupled to the base of transistor N4, the emitter of transistor N4 is coupled to the ground through resistor R4, the collector of transistor N5 is coupled to the output of the band gap reference circuit, and the emitters of transistors N3 and N5 are coupled to the ground. In a preferred embodiment, the transistors N3, N4 and N5 are NPN type triode transistors.

In a preferred embodiment, a residual current absorption circuit comprises a transistor N6, whose collector is coupled to the output of the current source circuit, and its base coupled to the collector of transistor N5, and its emitter coupled to the ground. In a preferred embodiment, the transistor N6 is NPN type triode transistor.

In a preferred embodiment, in order to further improve the current linearity and stability of the output, the band gap reference circuit further comprises a resistor R5 and a capacitor C1, wherein one end of the resistor R5 is coupled to the output of the band gap reference circuit, the other end of R5 is coupled to an end of capacitor C1 and the collector of transistor N5, and the other end of capacitor C1 is coupled to the collector of transistor N3 and the base of transistor N5. But in another embodiment, resistor R5 and capacitor C1 are not adopted.

In one embodiment, a current source circuit comprises a second type transistor P1 and a current biasing circuit, where the second type transistor P1 is in a different doping type from the transistors N3, N4 and N5. The emitter of transistor P1 is coupled to the power source to receive an input voltage Vcc, its base is coupled to the current biasing circuit and the collector is used to provide the current source. In one embodiment, the transistor P1 is a PNP type triode transistor.

In one embodiment, the current biasing circuit comprises a starting circuit for staring at a low voltage and a biasing circuit. The starting circuit comprises a field effect transistor J1 and a second-type triode transistor N2, wherein the drain of transistor J1 is coupled to the power source, the source of J1 is coupled to the collector and base of transistor N2, and the gate of J1 and the emitter of transistor N2 are coupled to the ground.

The biasing circuit comprises first type triode transistors P2 and P3, second type triode transistor N1 and resistor R1, wherein the emitters of transistors P2 and P3 are coupled to the power source, the bases of transistors P2 and P3 are coupled to the collector of transistor P2, the collector of transistor N1 is coupled to the collector of transistor P2, the base of transistor N1 is coupled to the base and collector of transistor N2, the emitter of N1 is coupled to the ground through resistor R1, and the collector of transistor P3 is coupled to the source of the FET transistor J1 and to the base and collector of transistor N2.

In the above band gap reference circuit, it satisfies:

$$Vref = VBE3 + (\Delta VBE/R4 + IB3*R3)$$

$$IB3 = Ic3/\beta = ((Vref - VBE5)/R2)/\beta$$

$$\Delta Vref = \Delta IB3*R3 \approx 0$$

In the equations, IB3 represents the base current of transistor N3, Ic3 represents the collector current of transistor N3, β represents the amplification ratio of the NPN transistor, and Ie3, Ie4, Ae3, Ae4 represent the emitter currents and the effective emitter areas of transistors N3 and N4 respectively. By adjusting the ratio of the two effective emitter areas and the ratio of R3 to R4, a zero temperature coefficient for the reference voltage Vref can be achieved.

Meanwhile, the residual current Ip from transistor P1 would be finally absorbed by transistor N6. When the collector current of transistor P1 changes, the base current Ib6 of transistor N6 would also change, but the change of Ib6 is minor compared to the collector current Icy of transistor N5, and the reflected change of base current Ib5 of transistor N5 can be neglected. Accordingly, the reference voltage Vref is not sensitive to the change of collector current Ic6 of N6, and the current linearity and stability of voltage Vref are improved.

On the other hand, transistor J1 is a JFET, and coupled to the ground through transistor N2. The starting voltage of JFET is about 0.1 volts, and the starting voltage of transistor N2 is about 0.6 volts, thus when the input voltage Vcc of the power source is above 0.7 volts, there generates the current in the starting circuit. And this current is used as a starting signal to start the entire system.

At the mean time, the collector of transistor P1 functions as an output of the current source circuit, and provides a current source. In one embodiment, the band gap reference voltage Vref for the band gap reference circuit is set at about 1.25 volts, and the saturation voltage drop of transistor P1 is at about 0.25 volts, thus when the input voltage Vcc of the power source is at or above 1.5 volts, a steady reference voltage of 1.25 volts can be provided. With this improved configuration, the band gap reference circuit can provide steady band gap reference voltage for the waveform generating circuit at an input voltage at the range of 1.5~36 volts, assuring that the driving circuit working with stability and reliability.

Figure 8:
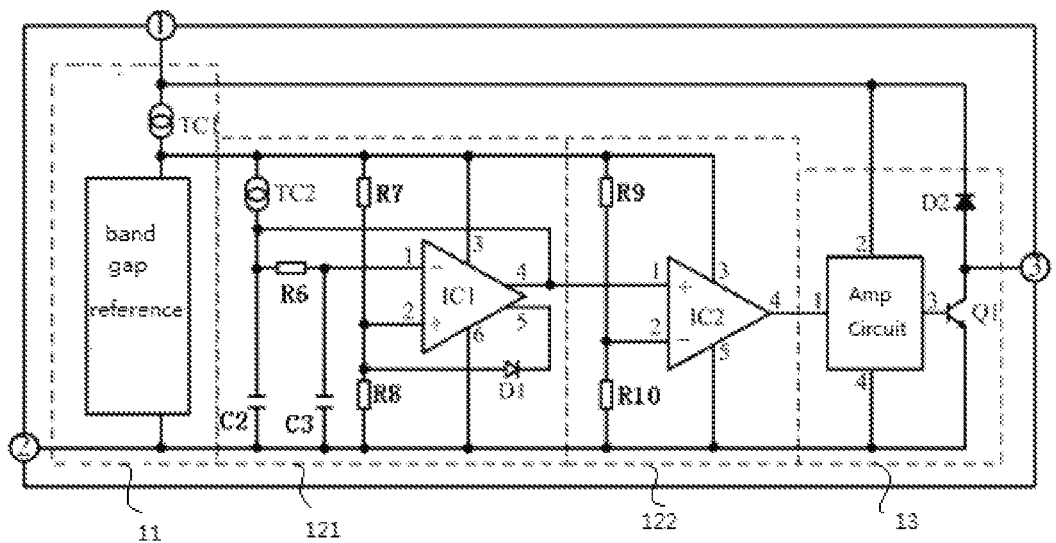
FIG. 8 illustrates a circuit diagram of a driving circuit according to an embodiment of the present invention.
Figure 9:
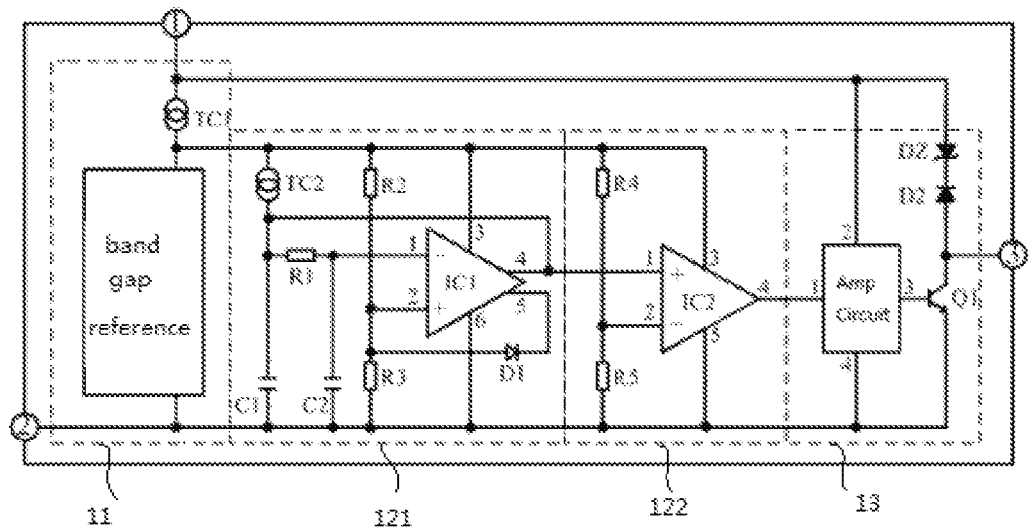
FIG. 9 illustrates a circuit diagram of another driving circuit according to an embodiment of the present invention.

In one embodiment, as shown in FIG. 8 and FIG. 9, the current source circuit in the voltage regulating circuit may be also called a first current source TC1. And the band gap reference circuit and the residual current absorption circuit together can be called a band gap reference, accordingly, the voltage regulating circuit comprises the first current source TC1, and the band gap reference, wherein the input of the first current source is coupled to the power source, the output of the first current source is coupled to the band gap reference, the output of the band gap reference is coupled to the input of the waveform generating circuit.

As shown in FIG. 4, the first current source TC1 comprises first type transistors P1, P2 and P3, second type transistors N1 and N2, a FET transistor J1 and a resistor R1. Wherein the emitters of transistors P2 and P3 are coupled to the power source configured to receive the input power, the bases of P2 and P3 are coupled together configured to behave as the output of the biasing circuit; transistor P1 has its emitter receiving the input power, its base coupled to the output of the biasing circuit and its collector functioning as the output of the first current source TC1 to provide a current for the band gap reference; the collector of transistor P2 is coupled to the collector of transistor N1, the collector of transistor P3 is coupled to the collector of transistor N2, the bases of transistors N1 and N2 are coupled together, the emitter of transistor N1 is coupled to the ground through resistor R1, and the emitter of transistor N2 are coupled to the ground; JFET transistor J1 has its drain receiving the input power, its source coupled to the collectors of transistors P3 and N2, and its gate coupled to the ground. The band gap reference comprises second type transistors N3, N4, N5 and N6, resistors R2, R3, R4, and R5, and a capacitor C1. Wherein one ends of resistors R2, R3 and R5 and the collector of transistor N6 are coupled to the output of the first current source TC1, and function as the output of the band gap reference; the other end of resistor R3 is coupled to the collector of transistor N4, the other end of resistor R2 is coupled to one end of capacitor C1, the collector of transistor N3 and the base of transistor N5; the bases of transistors N3 and N4 are coupled together; the emitter of transistor N4 is coupled to the ground through resistor R4; the other end of resistor R5 is coupled to the other end of capacitor C1; the collector of transistor N5, the base of transistor N6 and the emitters of transistors N3, N5 and N6 are coupled to the ground.

In an embodiment, the waveform generating circuit comprises a triangular waveform generating circuit and a waveform transforming circuit which is coupled to the triangular waveform generating circuit. Wherein the triangular waveform generating circuit is configured to provide periodic triangular wave signal, and the waveform transforming circuit is configured to transform the triangular wave signal into square wave signal.

Figure 5:
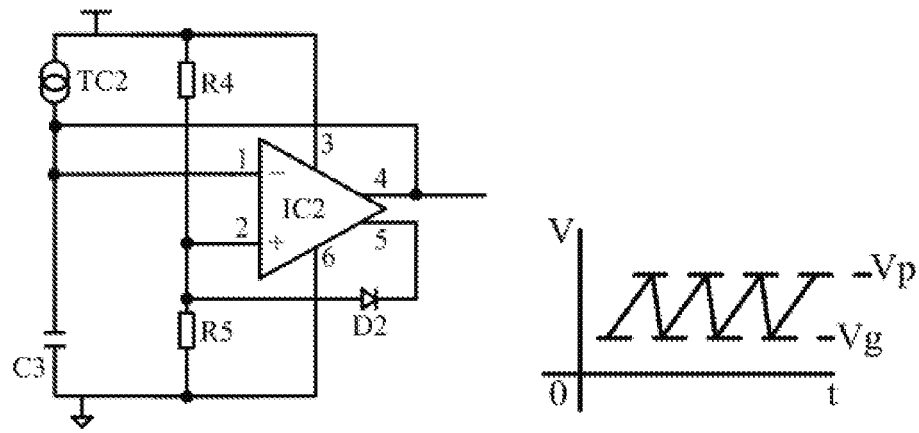
FIG. 5 illustrates a circuit diagram and a corresponding waveform diagram of a triangular waveform generating circuit according to an embodiment of the present invention.

FIG. 5 illustrates a circuit diagram and a corresponding waveform diagram of a triangular waveform generating circuit according to an embodiment of the present invention.

The triangular waveform generating circuit comprises a second current source TC2 which is coupled to the output of the voltage regulating circuit for receiving a regulated reference voltage, a capacitor C3 which is coupled between the output of the second current source TC2 and the ground, serially coupled resistors R4 and R5 which is used to provide a reference voltage, a comparator IC2 and a diode D2. One end of resistor R4 is coupled to the output of the voltage regulating circuit, the second end of resistor R4 is coupled to the first end of resistor R5 and functions as the output of reference circuit comprising R4 and R5, and the second end of resistor R5 is coupled to the ground. Comparator IC2 has its inverting input (end 1) coupled to the output of current source TC2, its non-inverting input (end 2) coupled to the second end of the resistor R4, its first output (end 4) coupled to the output of current source IC2 and functioning as the output of the triangular waveform generating circuit, and its second output (end 5) coupled to the first end of resistor R5 through a reversely biased diode D2.

When capacitor C3 is charged to the peak voltage Vp, comparator IC2 is overturned, and its output (ends 4 and 5) starts to pull current, and the output of the comparator IC2 decreases to about 0.7 volts, and capacitor C3 starts to discharge. When the voltage across C3 is discharged to the bottom voltage Vg of about 0.7 volts, the comparator IC2 is overturned again, and the output (ends 4 and 5) are cut off, and capacitor C3 starts to be charged again. And this corresponds to one cycle of the triangular waveform.

However, this circuit has a drawback: since the discharging speed at end 4 of comparator IC2 is too fast, and comparator IC2 has some delay, the triangular wave signal would be over discharged at the bottom, and accordingly the bottom voltage Vg is undesirably unstable.

In order to overcome this drawback, an improved triangular waveform generating circuit comprises: a current source, has its input coupled to a power source; a first capacitor, coupled to the output of the current source and the ground; a comparing circuit, having a first input, a second input and an output, wherein the first input is configured to receive a periodic signal, the second input is configured to receive a reference voltage signal, and the output is configured to provide a triangular wave signal; a first resistor, having a first end coupled to the output of the current source, a second end coupled to the first input of the comparing circuit; and a second capacitor, coupled between the second end of the first resistor and the ground, and the first resistor and the second capacitor are configured to discharge the first capacitor completely.

This configuration adopts additional resistor and capacitor at the input of the periodic input signal, which improves the discharging performance and the bottom voltage of the triangular wave signal can be discharged completely to zero. Accordingly, the peak-bottom value of the triangular wave signal is increased and the consistency and temperature performance of the circuit is improved.

Here bellow illustrates a detailed example of the improved triangular waveform generating circuit.

Figure 6:
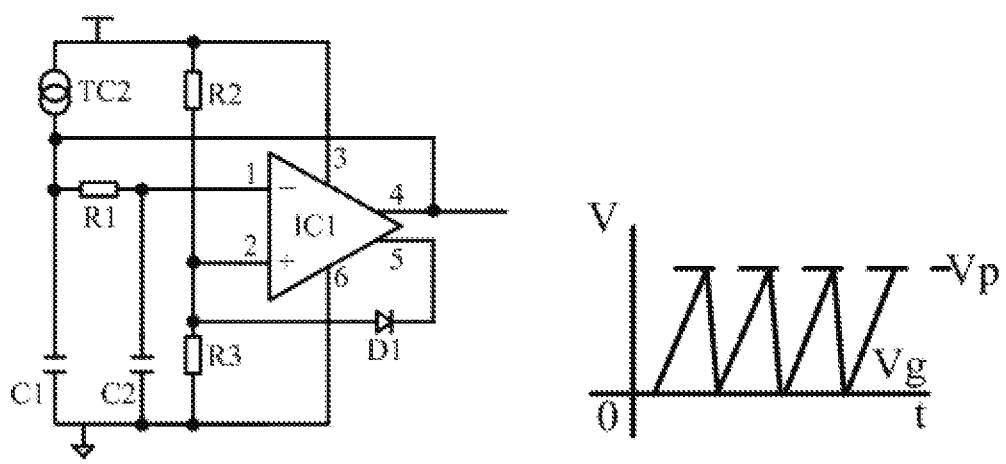
FIG. 6 illustrates a circuit diagram and a corresponding waveform diagram of a triangular waveform generating circuit according to a preferred embodiment of the present invention.

FIG. 6 illustrates a circuit diagram and a corresponding waveform diagram of a triangular waveform generating circuit in the circuit of FIG. 2 according to a preferred embodiment of the present invention. The triangular waveform generating circuit comprises: a current source TC2 coupled to a voltage source preferred the output of the voltage regulating circuit for receiving a regulated reference voltage, a first capacitor C1 coupled between the output of the current source TC2 and the ground, a first resistor FR1 having a first end coupled to the output of the current source TC2 and having a second end coupled to the first input of a comparing circuit, a second capacitor C2 coupled between the second end of the first resistor R1 and the ground, and the comparing circuit having the first input, a second input and an output.

Wherein, the first input of the comparing circuit is configured to receive a periodic signal, the second input of the comparing circuit is configured to receive a reference voltage, and the output of the comparing circuit is configured to provide a triangular wave signal. The first resistor R1 and the second capacitor C2 are used to discharge the first capacitor C1 completely.

Besides, the triangular waveform generating circuit may further comprise a second resistor R2 and a third resistor R3. Wherein the first resistor R2 has a first end coupled to a voltage source such as the output of the voltage regulating circuit, a second end coupled to the first end of the third resistor R3 functioning as an output of a reference circuit. And the second end of resistor R3 is coupled to the ground.

The comparing circuit may comprise a comparator IC1 and a diode D1. The inverting input (end 1) of the comparator 101 is coupled to the second end of the first resistor R1, the non-inverting input (end 2) of comparator IC1 is coupled to the output of the reference circuit; the output (end 4) of the comparator IC1 is coupled to the output of the current source, and functions as the output of the triangular waveform generating circuit, and the output (end 5) of the comparator IC1 is coupled to the output of the reference circuit through a reversely biased diode D1.

In this embodiment, additional resistor R1 and capacitor C2 are added to the discharging loop, and the detection at input (end 1) of comparator 101 has some delay to ensure complete discharge of capacitor C1. And accordingly, the bottom voltage of triangular wave signal can be discharged fully to zero. This increases the peak voltage of the triangular wave signal and improves the consistency of the system. At the meantime, since the bottom voltage is fully discharged to zero, the bottom voltage will not fluctuate along with the changes of input voltage and temperature, thus the temperature performance of the circuit is also improved.

Figure 7:
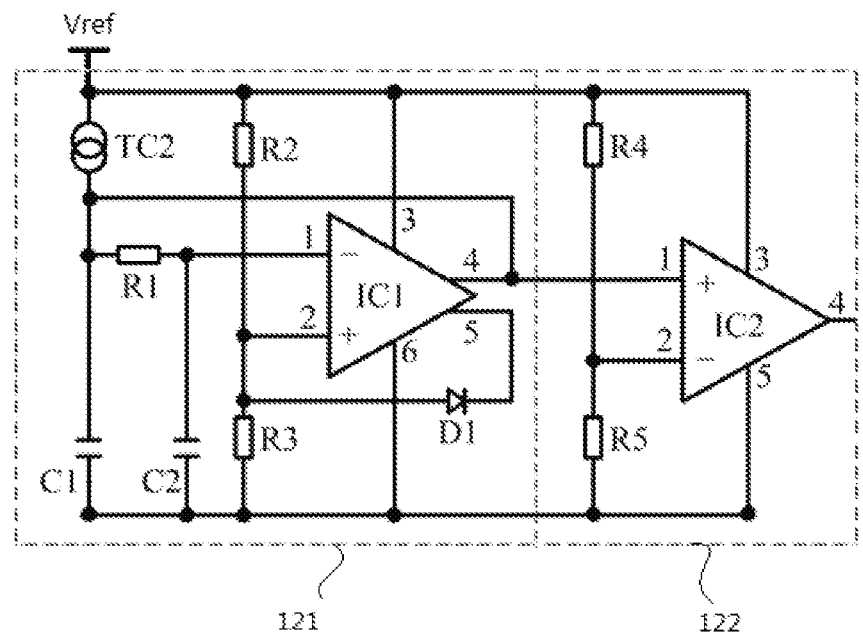
FIG. 7 illustrates a circuit diagram of a waveform generating circuit comprising a triangular waveform generating circuit and a waveform transforming circuit according to an embodiment of the present invention.

FIG. 7 illustrates a waveform generating circuit comprising a triangular waveform generating circuit 121 and a waveform transforming circuit 122 in the circuit of FIG. 2 according to an embodiment of the present invention. The waveform transforming circuit 122 comprises resistors R4 and R5, and a second comparator IC2. Wherein a first end of resistor R4 is coupled to the output of the voltage regulating circuit, the second end of resistor R4 is coupled to the first end of resistor R5 and the inverting input of comparator IC2. The non-inverting input of comparator IC2 is coupled to the output (end 4) of the first comparator IC1, and the output of comparator IC2 is coupled to the signal input of a driving circuit; the second end of resistor R5 is coupled to the ground.

FIG. 8 illustrates a circuit diagram of a driving circuit according to an embodiment of the present invention. This embodiment adopts the preferred embodiments of circuits as illustrated in the above descriptions. Wherein the driving stage circuit 13 comprises an amplification circuit, an amplifying transistor Q1 and a freewheeling diode D2. A first input (end 1) of the amplification circuit is coupled to the output of the waveform signal generating circuit, a second input (end 2) is coupled to the power source for receiving the input power, a third end (end 3) as the output is coupled to base of amplifying transistor Q1, and a fourth end (end 4) is coupled to the ground. The collector of transistor Q1 is coupled to the anode of diode D2 and functions as the output which is to drive the load of electronic device. The emitter of transistor Q1 is coupled to the ground. The cathode of diode D2 is coupled to the power source.

With this configuration, when the power source and the ground are reversely connected, there will form a diode between the ground and the output (end 3) of the amplification circuit which has a breakdown voltage of about 0.7 volts. A normal freewheeling diode also has a breakdown voltage of about 0.7 volts, and thus the reverse breakdown voltage between GND and the power source is only 1.4 volts, and the circuit would be damaged under a higher reverse voltage.

In order to improve the reverse breakdown voltage, FIG. 9 provides a preferred embodiment compared to that in FIG. 8. FIG. 9 illustrates a circuit diagram of another driving stage circuit according to an embodiment of the present invention. In FIG. 9, an additional Zener diode DZ is coupled in series with the freewheeling diode D2, where the cathodes of the Zener diode DZ and the freewheeling diode D2 are coupled together.

With this improvement, the reverse on voltage between the ground GND and the input power source increases to about 14.7 volts, and the reverse breakdown voltage increases to about 18 volts. Besides, in some application tests, the addition of the Zener diode DZ improves the audio performance of the buzzer which makes the sound louder.

In some embodiments, the circuit illustrated in FIG. 8 or FIG. 9 is integrated on a semiconductor chip or in one semiconductor package, where the first pin 1 of the chip is configured to receive the input power, the second pin 2 is coupled to the ground, and the third pin 3 is internally coupled to the output of the driving stage circuit and externally coupled to the electronic device such as a buzzer for driving the electronic device. FIG. 10 illustrates a driving system according to an embodiment of the present invention. The driving system comprises a driving circuit and a buzzer. The driving circuit may be in any form of the above mentioned embodiments. A first pin 1 of the driving circuit is coupled to the power source Vcc, a second pin 2 is coupled to the ground, and a third pin 3 as the output of the driving circuit is coupled to and configured to drive the buzzer. Another end of the buzzer is coupled to the power source Vcc. However, the other end of the buzzer may be coupled to another source.

The above illustrated driving circuits according to embodiments of the present invention have broad input power range, require few external components and have low cost, and are easy for circuit debugging and circuit installation. In some embodiments such as in FIG. 9, the driving circuit is robust to sustain reverse ground connection. And thus the above illustrated driving circuits according to embodiments of the present invention can satisfy most requirements in the field.

Referring to FIG. 8, the triangular waveform generating circuit 121 comprises a second current source TC2, resistors R6, R7 and R8, capacitors C2 and C3, a diode D1 and a first comparator IC1. Wherein the input of the second current source TC2 is coupled to the output of the voltage regulating circuit, the output of TC2 is coupled to the first end of resistor R6, the first end of capacitor C2 and the output of the first comparator IC1. The second end of resistor R6 is coupled to the first end of capacitor C3 and the inverting input of comparator IC1; a first end of resistor R7 is coupled the output of the voltage regulating circuit, and a second end of resistor R7 is coupled to a second end of resistor R8, the anode of diode D1 and a non-inverting input (end 2) of the first comparator IC1; the cathode of diode D1 is coupled to an output (end 5) of the first comparator IC1; and the second ends of capacitors C2, C3 and resistor R8 are coupled to the ground.

The waveform transforming circuit 122 comprises resistors R4, R5 and a second comparator IC2, wherein a first end of resistor R5 is coupled to the output of the voltage regulating circuit, a second end of resistor R5 is coupled to a first end of resistor R2 and an inverting input of the second comparator IC2. A non-inverting input of the second comparator IC2 is coupled to the output (end 4) of the first comparator IC1, and the output of comparator IC2 is coupled to the signal input end of the driving stage circuit. And a second end of resistor R2 is coupled to the ground.

From the above descriptions, it is apparent that in an embodiment, a method of driving an electronic device comprises: converting an input voltage into a regulated reference voltage; supplying a waveform generating circuit by the regulated reference voltage and generating a periodic wave signal; supplying the periodic wave signal to a signal input of a driving stage circuit, supplying the input voltage into a power input of the driving stage circuit and providing a driving signal for driving the electronic device. In an embodiment, the regulated reference voltage is a band gap reference voltage. The regulated reference voltage is regulated at a predetermined voltage level, thus the input voltage having a large varying range such as at a range of 1.5~36 volts can be regulated at a predetermined voltage such as 1.25 volts and can satisfy the need of the system.

According to an embodiment, the method of converting an input voltage into a regulated reference voltage comprises: supplying the input voltage into a current source circuit to obtain a current source; supplying the current source to a band gap reference circuit to obtain a band gap reference voltage; and absorbing a portion of current from the current source for stabilizing the band gap reference voltage.

In an embodiment, the method of absorbing a portion of current from the current source for stabilizing the band gap reference voltage comprises: coupling a first end of a transistor to an output of the current source circuit; coupling a second end of the transistor to the ground; and coupling a control end of the transistor to an end of the band gap reference circuit.

In an embodiment, the method of supplying a waveform generating circuit by the band gap reference voltage and generating a periodic wave signal comprises: generating a triangular wave signal at an output of a comparing circuit; coupling a resistor between a current source circuit and a first input of the comparing circuit; coupling a capacitor between the first input of the comparing circuit and a ground; and transforming the triangular wave signal into a square wave signal.

It will be appreciated by persons skilled in the art that the present invention is not limited to what has been particularly shown and described herein above. Rather the scope of the present invention is defined by the claims and includes both combinations and sub-combinations of the various features described herein above as well as variations and modifications thereof which would occur to persons skilled in the art upon reading the foregoing description and which are not in the prior art.

We claim:

1. A driving circuit for driving an electronic device, comprising:
    a voltage regulating circuit having an input and an output, wherein the input is coupled to a power source;
    a waveform generating circuit having an input and an output, wherein the input of the waveform generating circuit is coupled to the output of the voltage regulating circuit, and the output of the waveform generating circuit is configured to provide a periodic wave signal; and
    a driving stage circuit having a signal input, a power input and an output, wherein the signal input is coupled to the output of the waveform generating circuit, the power input is coupled to the power source, and the output of the driving stage circuit is configured to drive the electronic device,
    wherein the voltage regulating circuit comprises:
        a current source circuit having an input and an output, wherein the input of the current source is coupled to the power source, and the output of the current source circuit is configured to provide a current source; and
        a band gap reference circuit having a first end and a second end, wherein the first end is coupled to the output of the current source circuit and is configured to provide a band gap reference voltage, the second end is coupled to a ground.

2. The driving circuit of claim 1, wherein the electronic device comprises a buzzer.

3. The driving circuit of claim 1, wherein the voltage regulating circuit further comprises a residual current absorption circuit coupled to the band gap reference circuit, wherein the residual current absorption circuit has a first end coupled to the first end of the band gap reference circuit and the output of the current source circuit, and has a second end coupled to the ground.

4. The driving circuit of claim 3, wherein the band gap reference circuit comprises:
    a first transistor having a first end, a second end and a control end, wherein the first end of the first transistor is coupled to the first end of the band gap reference circuit through a first resistor, and the second end of the first transistor is coupled to the ground;
    a second transistor having a first end, a second end and a control end, wherein the first of the second transistor is coupled to the first end of the band gap reference circuit through a second resistor, the second end of the second transistor is coupled to the ground through a third resistor, and the control end of the second transistor is coupled to the control end of the first transistor and the first end of the second transistor; and
    a third transistor having a first end, a second end and a control end, wherein the first end of the third transistor is coupled to the first end of the band gap reference circuit, the second end of the third transistor is coupled to the ground, and the control end of the third transistor is coupled to the first end of the first transistor.

5. The driving circuit of claim 4, wherein the residual current absorption circuit comprises a fourth transistor having a first end, a second end and a control end, wherein the first end of the fourth transistor is coupled to the first end of the band gap reference circuit, the second end of the fourth transistor is coupled to the ground, and the control end of the fourth transistor is coupled to the first end of the third transistor.

6. The driving circuit of claim 4, wherein the band gap reference circuit further comprises:
    a capacitor coupled between the first end of the first transistor and the first end of the third transistor; and
    a fourth resistor coupled between the first end of the band gap reference circuit and the first end of the third transistor.

7. The driving circuit of claim 1, wherein the current source circuit comprises:
    a first-type transistor having a first end, a second end and a control end, wherein the first end of the first-type transistor is coupled to the power source;
    a starting circuit comprising a Junction Field Effect Transistor (JFET) and a second-type transistor, wherein a drain of the JFET is coupled to the power source, a source of the JFET is coupled a first end and a control end of the second-type transistor, and a gate of the JFET is coupled to the ground; and
    a biasing circuit having a first end coupled to a second end of the second-type transistor, and having a second end coupled to the control end of the first-type transistor, and further wherein the second end of the first-type transistor is configured to provide the current source.

8. The driving circuit of claim 1, wherein the waveform generating circuit comprises:
    a triangular waveform generating circuit configured to generate a triangular wave signal; and
    a waveform transforming circuit configured to transform the triangular wave signal into a square wave signal.

9. The driving circuit of claim 8, wherein the triangular waveform generating circuit comprises:
    a current source circuit having an input coupled to the output of the voltage regulating circuit;
    a first capacitor coupled between an output of the current source circuit and a ground;
    a comparing circuit having a first input, a second input and an output, wherein the second input is configured to receive a reference voltage generated based on the output of the voltage regulating circuit, the output of the comparing circuit is configured to provide a triangular wave signal;
    a resistor coupled between an output of the current source circuit and the first input of the comparing circuit; and
    a second capacitor coupled between the first input of the comparing circuit and the ground.

10. The driving circuit of claim 9, wherein the comparing circuit comprises a first comparator and a diode, wherein an inverting input of the comparator is coupled to the resistor, a non-inverting input of the comparator is coupled to a reference voltage generating circuit and an output of the comparator is coupled to the output of the current source circuit and the output of the reference voltage generating circuit through the reversely biased diode.

11. The driving circuit of claim 8, wherein the waveform transforming circuit comprises a second comparator having an inverting input configured to receive a reference voltage generated based on the output of the voltage regulating circuit, a non-inverting input coupled to the output of the first comparator and an output configured to provide the square wave signal.

12. The driving circuit of claim 1, wherein the driving stage circuit comprises:
   an amplification circuit having a signal input, a power input, a ground input and an output, wherein the signal input of the amplification circuit is coupled to the output of the waveform generating circuit, the power input is coupled to the power source;
   a triode transistor having a base coupled to the output of the amplification circuit, an emitter coupled to the ground; and
   a freewheeling diode having a cathode coupled to the power source and an anode coupled to a collector of the triode transistor and configured to provide a driving signal for driving the electronic device.

13. The driving circuit of claim 12, wherein the driving stage circuit further comprises a Zener diode coupled in series with the freewheeling diode, and wherein where the cathodes of the Zener diode and the freewheeling diode are coupled together.

14. The driving circuit of claim 1, wherein the driving circuit is integrated in a semiconductor chip, the semiconductor chip having a first pin coupled to the power source, a second pin coupled to the ground, and a third pin coupled to the output of the driving circuit configured to drive the electronic device.

15. A driving system for an electronic device, comprising:
   a buzzer;
   a voltage regulating circuit having an input and an output, wherein the input is coupled to a power source;
   a waveform generating circuit having an input and an output, wherein the input of the waveform generating circuit is coupled to the output of the voltage regulating circuit, and the output of the waveform generating circuit is configured to provide a periodic wave signal; and
   a driving stage circuit having a signal input, a power input and an output, wherein the signal input is coupled to the output of the waveform generating circuit, the power input is coupled to the power source, and the output of the driving stage circuit is coupled to the buzzer
   wherein the voltage regulating circuit comprises:
      a current source circuit having an input and an output, wherein the input of the current source is coupled to the power source, the output of the current source circuit is configured to provide a current source;
      a band gap reference circuit having a first end and a second end, wherein the first end is coupled to the output of the current source circuit and is configured to provide a band gap reference voltage, the second end is coupled to a ground; and
      a residual current absorption circuit coupled to the band gap reference circuit, wherein the residual current absorption circuit has a first end coupled to the first end of the band gap reference circuit and the output of the current source circuit, and has a second end coupled to the ground.

16. The driving system of claim 15, wherein the waveform generating circuit comprises a triangular waveform generating circuit configured to generate a triangular wave signal and a waveform transforming circuit configured to transform the triangular wave signal into square wave signal, wherein the triangular waveform generating circuit comprises:
   a current source circuit having an input coupled to the output of the voltage regulating circuit;
   a first capacitor coupled between an output of the current source circuit and a ground;
   a comparing circuit having a first input, a second input and an output, wherein the second input is configured to receive a reference voltage, the output of the comparing circuit is configured to provide a triangular wave signal;
   a resistor coupled between an output of the current source circuit and the first input of the comparing circuit; and
   a second capacitor coupled between the first input of the comparing circuit and the ground.

17. A method of driving an electronic device, comprising:
   converting an input voltage into a regulated reference voltage;
   supplying a waveform generating circuit by the regulated reference voltage and generating a periodic wave signal;
   supplying the periodic wave signal to a signal input of a driving stage circuit, supplying the input voltage into a power input of the driving stage circuit and providing a driving signal for driving the electronic device,
   wherein converting an input voltage into a regulated reference voltage comprises:
      supplying the input voltage into a current source circuit to obtain a current source;
      supplying the current source to a band gap reference circuit to obtain a band gap reference voltage; and
      absorbing a portion of current from the current source for stabilizing the band gap reference voltage.

* * * * *